United States Patent
Kratzer et al.

(10) Patent No.: US 10,056,778 B2
(45) Date of Patent: Aug. 21, 2018

(54) METHOD AND DEVICE FOR LIMITING THE CURRENT IN A TEMPERATURE-DEPENDENT MANNER OF AN ENERGY STORAGE DEVICE FOR ELECTRICAL ENERGY

(71) Applicant: MAN Truck & Bus AG, München (DE)

(72) Inventors: Sebastian Kratzer, München (DE); Susanne Büschel, München (DE); Bernd Müller, München (DE)

(73) Assignee: MAN TRUCK & BUS AG, Munich (DE)

( * ) Notice: Subject to any disclaimer, the term of this patent is extended or adjusted under 35 U.S.C. 154(b) by 242 days.

(21) Appl. No.: 15/011,002

(22) Filed: Jan. 29, 2016

(65) Prior Publication Data
US 2016/0226291 A1 Aug. 4, 2016

(30) Foreign Application Priority Data

Jan. 29, 2015 (DE) .................. 10 2015 001 069

(51) Int. Cl.
| | | |
|---|---|---|
| *H02J 7/04* | (2006.01) | |
| *H02J 7/16* | (2006.01) | |
| *H02J 7/00* | (2006.01) | |
| *B60L 3/12* | (2006.01) | |
| *B60L 11/18* | (2006.01) | |
| *H01M 10/44* | (2006.01) | |
| *H01M 10/48* | (2006.01) | |

(52) U.S. Cl.
CPC .............. *H02J 7/0091* (2013.01); *B60L 3/12* (2013.01); *B60L 11/1872* (2013.01);
(Continued)

(58) Field of Classification Search
CPC ................................................ G06F 17/30598
(Continued)

(56) References Cited

U.S. PATENT DOCUMENTS 9,007,028 B2 4/2015 Tashiro
9,252,823 B2 2/2016 Se-Sub Sim et al.
(Continued)

FOREIGN PATENT DOCUMENTS

DE 10 2007 010 751 A1 8/2008
DE 10 2007 063 178 A1 6/2009
(Continued)

OTHER PUBLICATIONS

European Office Action dated Aug. 3, 2017 for corresponding European Application No. 150032438.

*Primary Examiner* — Edward Tso
*Assistant Examiner* — Ahmed Omar
(74) *Attorney, Agent, or Firm* — Lucas & Mercanti, LLP

(57) ABSTRACT

A method and a device for limiting the current in a temperature-dependent manner of an energy storage device for electrical energy adjusts a maximum permissible charging and/or discharging current of the energy storage device in dependence upon a temperature of the energy storage device, wherein the following steps are performed: determining multiple temperature values of the energy storage device that follow one another chronologically during a prevailing time interval; determining a prevailing mean temperature value of the energy storage device from the determined temperature values of the energy storage device during the prevailing time interval; comparing the determined prevailing mean value with a predetermined desired temperature value; and, if the determined prevailing mean value is greater than the desired temperature value, limiting the maximum permissible charging and/or discharging current of the energy storage device.

15 Claims, 2 Drawing Sheets

(52) U.S. Cl.
CPC ....... *H01M 10/443* (2013.01); *H01M 10/486* (2013.01); *H02J 7/047* (2013.01); *B60L 2240/545* (2013.01); *B60L 2240/549* (2013.01); *H01M 2200/10* (2013.01); *H01M 2220/20* (2013.01); *Y02T 10/705* (2013.01); *Y02T 10/7011* (2013.01)

(58) Field of Classification Search
USPC .................................................. 320/153, 150
See application file for complete search history.

(56) References Cited

U.S. PATENT DOCUMENTS

| | | |
|---|---|---|
| 2006/0152196 A1 | 7/2006 | Matsumoto |
| 2009/0085527 A1 | 4/2009 | Odaohhara |
| 2009/0153104 A1 | 6/2009 | Matsuura et al. |
| 2009/0212626 A1 | 8/2009 | Snyder |
| 2012/0056587 A1* | 3/2012 | Iida ................... H01M 10/441 320/118 |
| 2013/0181683 A1 | 7/2013 | Wang et al. |
| 2014/0070761 A1* | 3/2014 | Labbe ................... A61N 1/378 320/108 |
| 2014/0084873 A1 | 3/2014 | Sim et al. |

FOREIGN PATENT DOCUMENTS

| | | |
|---|---|---|
| DE | 112010005527 T5 | 1/2013 |
| EP | 1701175 A2 | 9/2006 |
| EP | 2712018 A1 | 3/2014 |
| EP | 2824753 A1 | 1/2015 |
| GB | 2286299 A | 8/1995 |
| WO | 2010121831 A1 | 10/2010 |

\* cited by examiner

METHOD AND DEVICE FOR LIMITING THE CURRENT IN A TEMPERATURE-DEPENDENT MANNER OF AN ENERGY STORAGE DEVICE FOR ELECTRICAL ENERGY

CROSS-REFERENCE TO RELATED APPLICATIONS

The present application claims priority of DE 10 2015 001 069.7 filed Jan. 29, 2015, which is incorporated herein by reference.

BACKGROUND OF THE INVENTION

The invention relates to a method and a device for limiting the current in a temperature-dependent manner of an energy storage device for electrical energy.

High voltage batteries, also known as battery packs, are known from the prior art, the high voltage batteries being in mild hybrid, hybrid or electric vehicles and are embodied from multiple individual cells, for example lithium ion cells, that are connected in series and/or in parallel. It is known that the temperature of the cells both during operation as well as while the vehicle is at a standstill influences the serviceable life of the high voltage battery, wherein in particular temperatures that are too high are detrimental to the serviceable life.

So as to limit the aging process caused by the influence of temperature, it is known from the prior art, by way of example DE 10 2007 063 178 A1, DE 10 2007 010 751 A1 or WO 2010/121831 A1, that high voltage batteries of this type are tempered by a cooling system and cooling plates that have fluid flowing through them in order to dissipate any lost heat that occurs so that the temperature of the electrical energy storage device never departs from the permissible operating range.

In addition, it is known from practical use to provide a maximum permissible charging and/or discharging current of the energy storage device so as to limit the thermal loading of the energy storage device, in other words to set an upper limit of the permissible current with which it is possible to charge the energy storage device for the duration of a predetermined time interval or with which it is possible to discharge the energy storage device for the duration of a predetermined time interval, in order not to exceed fixed temperature threshold values. Threshold values of this type can be fixed or set with a view to achieving a desired serviceable life of the energy storage device. However, the disadvantage in this case is that the provision of fixed temperature threshold values of this type for the charging and/or discharging current of the energy storage device is associated with a reduced power capability and flexibility in relation to temporarily fulfilling requirements for high power.

BRIEF SUMMARY OF THE INVENTION

An object of the invention to provide an improved operating method for an energy storage device for electrical energy, with which the disadvantages of conventional operating methods can be avoided. More specifically, the object of the invention is to provide a method for limiting the current in a temperature-dependent manner of an energy storage device of this type and wherein it is possible using said method to prevent the thermal operating thresholds from being continuously exceeded and to simultaneously react in a flexible manner to the power requirements of the vehicle. A further object is to provide a device for limiting the current in a temperature-dependent manner of the energy storage device and wherein using said method it is possible to avoid disadvantages of conventional devices.

In accordance with a first embodiment of the invention, the mentioned objects are achieved by a method for limiting the current in a temperature-dependent manner of an energy storage device for electrical energy. In accordance with the method in accordance with the invention, a maximum permissible charging and/or discharging current of the energy storage device is adjusted in dependence upon a temperature of the energy storage device, wherein the following steps are performed: determining multiple temperature values of the energy storage device that follow one another chronologically during a prevailing time interval, in other words the temperature values of the energy storage device are measured at different points in time that follow one another chronologically in the respective prevailing time interval; determining a prevailing mean temperature value of the energy storage device during the prevailing time interval from the determined temperature values of the energy storage device; comparing the determined prevailing mean value with a predetermined desired temperature value and, if the determined prevailing mean value is greater than the desired temperature value, limiting the maximum permissible charging and/or discharging current of the energy storage device.

The invention therefore comprises the general technical doctrine for determining the upper thresholds for the charging and/or discharging currents in dependence upon a deviation or difference of a mean temperature value of the energy storage device from a predetermined desired value. The adjustment of the maximum permissible charging and/or discharging currents in dependence upon the temperature in comparison with the rigid threshold values offers the possibility of setting the maximum permissible charging and/or discharging currents over a wider range and only temporarily limiting said currents when required, in other words in the case of the mean temperature of the energy storage device exceeding a critical temperature threshold value. In accordance with the invention, not only is a value for an individual, instantaneously-measured temperature of the energy storage device compared with the critical temperature threshold value, but rather a value of the mean temperature of the energy storage device that represents the preceding progression of the temperature in the energy storage device over a defined time interval. This offers the advantage that temporarily higher temperatures are permitted in the energy storage device, said temperatures as is known greatly decrease the serviceable life if at another point in time lower temperatures are present in the energy storage device. As a consequence, the permissible current thresholds can be set over a wider range and the power capability of the energy storage device can be increased without having to accept an accelerated aging process in comparison to the prior art.

The term "energy storage device for electrical energy", hereinunder also described in short as an energy storage device or electrical energy storage device, comprises in particular traction batteries or high voltage batteries for mild hybrid, hybrid or electric vehicles. The term a "traction battery or a high voltage battery" is to be understood to mean a battery or a battery pack of preferably lithium ion cells for providing electrical energy for a purely electric motorized drive or at least a drive of a motor vehicle that is embodied as a mild hybrid, hybrid or electric vehicle, said drive being supported in an electric motorized manner.

The term "serviceable life" describes the time from when the energy storage device is first put into operation, at which point said energy storage device comprises an aging state (state of health, SoH) of 100% and consequently is at its full power capability, until reaching an end state of health that is described as 0%. A state that is described as 0% means in this context that the energy storage device comprises barely a predetermined minimum power capability and not that said energy storage device is absolutely no longer functional.

For energy storage devices that comprise a plurality of series-connected and/or parallel connected individual cells, for example lithium ion cells, the temperature values of the energy storage device provide a measure for the temperature values that prevail in the cells and said temperature values can be determined using measuring devices that are known per se from the prior art.

In one embodiment, the maximum permissible charging and/or discharging current is more greatly limited as the deviation of the mean value from the predetermined desired temperature value increases so that after exceeding the desired temperature value, the temperature of the energy storage device is decreased as rapidly as possible to said desired temperature value or to below said desired temperature value.

In accordance with a further embodiment, the prevailing mean temperature value of the energy storage device is determined as a weighted mean value, wherein high temperatures of energy storage device are more heavily weighted than low temperatures of the energy storage device. It is possible using this variant to automatically take into account and to compensate for the fact that higher temperatures of the energy storage device decrease the serviceable life of the energy storage device more than lower temperatures, whereby it is rendered possible to better optimize the serviceable life.

In the case of an advantageous variant of this embodiment, a look-up table is provided and each temperature value of the energy storage device can be allocated a weighting factor with reference to said look-up table. In addition, in accordance with this variant, the temperature values of the energy storage device during the prevailing time interval are multiplied by their respective allocated weighting factors and subsequently summed so as to determine the weighted mean value. The resulting sum is subsequently divided by the sum of the allocated weighting factor.

The prevailing mean temperature value of the energy storage device and thereby the adjustment of the maximum permissible charging and/or discharging current are preferably continuously or rather regularly determined. If, after a limitation of the maximum permissible charging and/or discharging current a subsequently determined prevailing mean value is no longer greater than the desired temperature value, the limitation of the maximum permissible charging and/or discharging current is cancelled or annulled.

In accordance with another embodiment of the invention, the temperature values T1 to Tn of the energy storage device that are used to continuously form the mean value are recorded in a storage device and a moving mean value is continuously formed from a specific number of recently stored temperature values T1 to Tn of the energy storage device, wherein in each case the one or multiple oldest temperature values of the energy storage device that is/are stored in the storage device is/are replaced by the newest. Consequently, starting from the prevailing point in time, the respective n recently measured temperature values of the energy storage device are used to form the mean value that is moving and consequently generally changing over time, whereby it is rendered possible to continuously and reliably determine the progression of the preceding mean temperature in the energy storage device.

The maximum permissible charging is determined by an upper threshold of the permissible current, with which the energy storage device can be charged for the duration of a newly beginning time interval. In a comparable manner, the maximum permissible discharging current is determined by an upper threshold of the current that can be drawn from the energy storage device for the duration of a newly beginning time interval of predetermined length. The permissible charging and/or discharging current of the energy storage device is/are adjusted by adjusting this upper threshold.

In addition, it is possible within the scope of the invention to set the maximum permissible charging and discharging currents of the energy storage device in each case in relation to at least two time intervals of different lengths. By way of example, a length of a first time interval can lie in the single digit seconds range and a length of a second time interval can lie in the double digit seconds range. By virtue of setting the current thresholds for charging and discharging the energy storage device for different timescales, the advantage is provided that, for example for short requirements for power that for example lie within the first time interval, higher permissible charging and discharging currents can be set than for longer requirements for power. For example maximum permissible charging and discharging currents of the energy storage device can be set in each case for time intervals of 2, 10 and 30 seconds. A maximum permissible charging of 100 A for the time interval of 2 seconds then provides by way of example that for the duration of 2 seconds, no more than a maximum current of 100 A can be drawn off.

In accordance with yet another embodiment of the invention, the method comprises in addition the steps of: determining a previous loading of the battery on the basis of stored operating data that provide the charging and/or discharging currents of the energy storage device in a prevailing and/or previous time interval; and adjusting the maximum permissible charging and/or discharging currents of the energy storage device in dependence upon the determined previous loading of the energy storage device. This embodiment is based on the knowledge that the power requirement that is demanded in a time interval prior to a prevailing calculation point and the battery current that results therefrom can considerably influence the permissible current thresholds for charging and discharging processes for future time intervals. It is advantageous in this case if the adjustment of the maximum permissible charging and/or discharging currents of the energy storage device is likewise continuously performed in dependence upon the previous loading of the energy storage device.

In accordance with this embodiment, in addition to an adjustment in a temperature-dependent manner of the maximum permissible charging and/or discharging currents of the energy storage device, an adjustment is consequently additionally performed on the basis of the previous loading of the energy storage device so that the current thresholds for charging and discharging the energy storage device, in particular for the future charging and/or discharging time intervals, are adjusted in a two-staged process.

In addition, it is advantageous in this case if a first adjustment of the respective hitherto valid maximum permissible charging and/or discharging currents of the energy storage device is performed in dependence upon the determined previous loading of the energy storage device and subsequently a second adjustment is performed in dependence upon the comparison of the determined prevailing mean temperature value of the energy storage device with the predetermined desired temperature value. The temperature-dependent adjustment of the maximum permissible charging and/or discharging currents based upon the temperature mean value is consequently used as an additional correction of the predicted permissible charging and/or discharging currents on the basis of the first adjustment.

In conclusion, it is possible within the scope of the invention that the values of the maximum permissible charging and/or discharging currents that are determined and where necessary adjusted by an open loop control device of the energy storage device in accordance with the above described aspects are continuously transmitted to a vehicle control unit so as to control the drive train components of the motor vehicle, wherein the vehicle control unit is configured so as to control an electrical machine as an actuator, said electrical machine being supplied with electrical energy by the energy storage device in accordance with the received values of the maximum permissible charging and/or discharging currents, said electrical machine being in particular the inverter of the motor vehicle.

In accordance with a further aspect of the invention, a device is provided for controlling in an open loop and/or closed loop manner a temperature of an energy storage device for electrical energy, said device being embodied to implement the method that is disclosed herein.

In addition, the invention relates to a motor vehicle, preferably a commercial vehicle, having a device of this type.

BRIEF DESCRIPTION OF THE DRAWINGS

The above described preferred embodiments and features of the invention can be combined with one another in an arbitrary manner. Further details and advantages of the invention are described hereinunder with reference to the attached drawings. In the drawings.

DETAILED DESCRIPTION OF THE PREFERRED EMBODIMENTS

Figure 1:
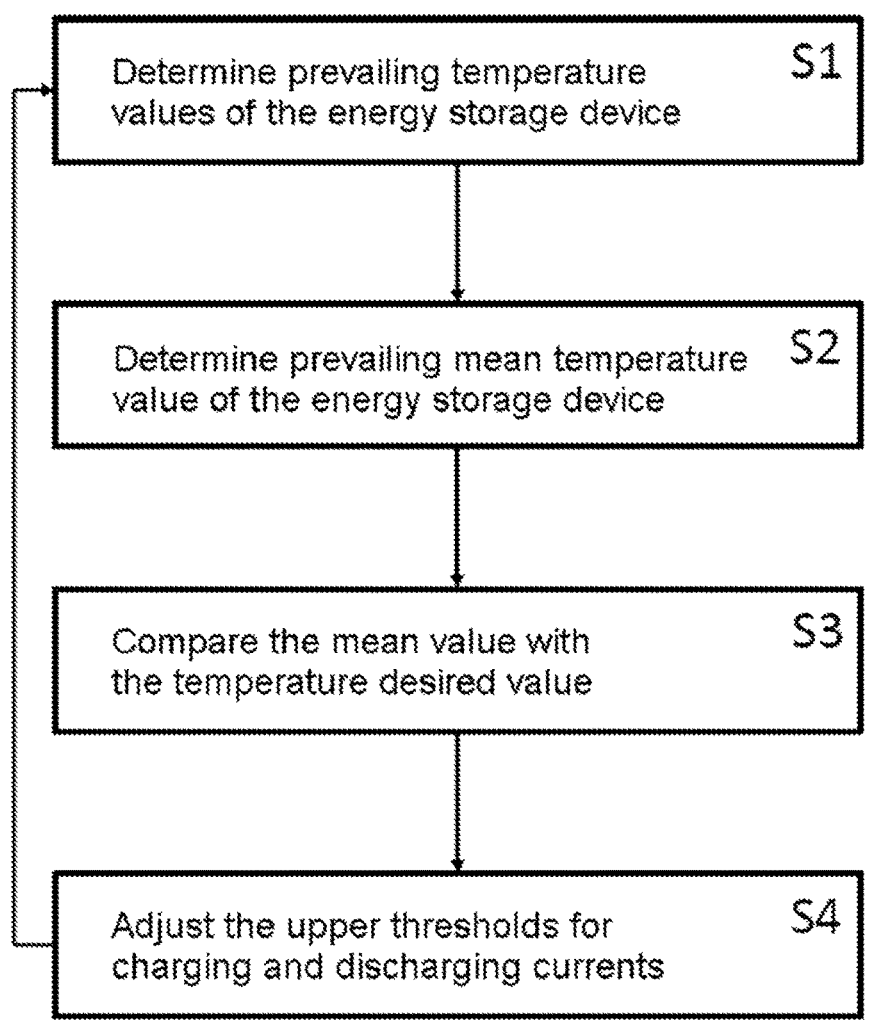
FIG. 1 illustrates a flow diagram for illustrating an embodiment of the method in accordance with the invention.

FIG. 1 illustrates a flow diagram for illustrating the adjustment of maximum permissible charging and discharging currents in dependence upon the temperature mean value of the energy storage device. Within the scope of the description of FIG. 1, reference is made hereinunder to FIG. 2 in order to illustrate details of the individual method steps.

In step S1, prevailing temperature values of the energy storage device are continuously determined during operation of the energy storage device and are stored in a storage device 3. The energy storage device in the present case is a traction battery (high voltage battery) of a commercial vehicle that comprises in a known manner a battery pack (not illustrated) of a plurality of individual cells. In addition, the battery comprises an open loop control unit that is characterized in FIG. 2 by the reference numeral 2. The battery comprises in a manner known per se temperature sensors for determining the prevailing temperature $T_{cell}$ of the individual cells, wherein measured temperature values of the individual cells $T_{cell}$ are determined at measuring points in time $t_i$ that follow one another in a chronologically continuous manner and said measured temperature values are stored in a storage device 3 for storing actual data of the battery. In lieu of measured temperature values of the individual cells $T_{cell}$, it is possible depending upon the embodiment of the temperature measuring device of the battery also to determine only measured temperature values for some cells or only for one cell.

Figure 2:
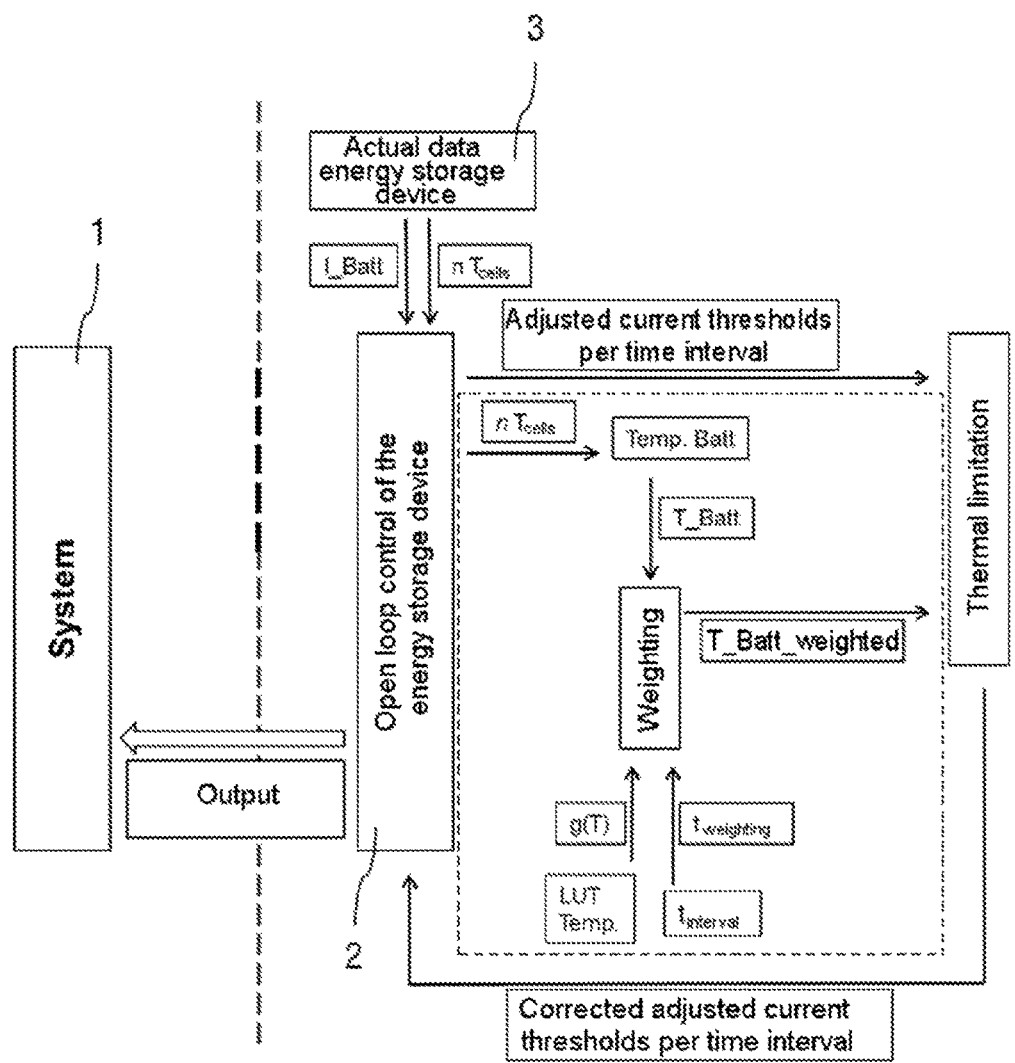
FIG. 2 illustrates schematically the calculation of adjusted maximum permissible charging and discharging currents in dependence upon the battery previous loading and the temperature mean value of the energy storage device in accordance with one embodiment of the invention.

In step S2, a prevailing mean value of the battery temperature is continuously determined from the measured temperature values of the battery in the form of the measured temperature values of the individual cells $T_{cell}$, the mean value representing the preceding progression of the temperature in the energy storage device over a defined time interval. The individual steps for calculating the mean value are illustrated in FIG. 2 within the box that is indicated by the broken line.

For this purpose, the open loop control unit 2 initially selects from the storage device 3 those n measured temperature values for each of the individual cells $T_{cell}$ that have been measured during a fixed, predetermined time interval at the measuring points in time $t_1$ to $t_n$ until the prevailing calculating point in time (prevailing time interval). In a subsequent processing step (described in FIG. 2 as "Temp. Batt"), an aggregated measured temperature value is calculated from the measured temperature values of the individual cells $T_{cells}$ that have been measured at the same measuring point in time, said measured temperature value being used as a measure for the battery temperature at the respective measuring point in time within the prevailing time interval. For this purpose, the measured temperature values of the individual cells $T_{cell}$ can be averaged, typically for this purpose more complex calculating methods are used that are known from the prior art. Overall, there is consequently n aggregated measured temperature values T1 to Tn (described in FIG. 2 as "T_Batt"), accordingly the n measuring points in time $t_i$, I=1 to n, in the prevailing time interval. These n measured temperature values T1 to Tn are further processed within the scope of the subsequent calculation of a weighted mean value (described in FIG. 2 as "weighting"). The energy storage device temperature in the prevailing time interval is determined as a weighted mean value, wherein high temperatures of the energy storage device are more heavily weighted than low temperatures of the energy storage device. For this purpose, a look-up table (described in FIG. 2 as "LUT Temp.") is provided and a weighting factor can be allocated with reference to each temperature value T1 to Tn of the energy storage device.

For a simple weighting process, the value 1 is used by way of example for temperatures that are within a predetermined mean temperature range, in the case of higher temperatures of the battery, this value can be greater than 1 and in the case of very low temperatures less than 1. As a consequence, the fact that a higher temperature decreases the serviceable life more rapidly than a low temperature is compensated for in this way.

Consequently, the corresponding weighting factor g(T) is determined for each temperature value T1 to Tn of the energy storage device with reference to the look-up table. The temperature values T1 to Tn of the energy storage device during the prevailing time interval are multiplied by their allocated weighting factor and then added so as to determine the weighted mean value. Finally, the sum of the allocated weighting factors $t_{weighting}$ is determined. In other words, in order to determine the weighted mean of the temperatures during a fixed time interval (t_interval), $t_{weighting}$ is further determined, wherein the time is also calculated using the prevailing weighting factors.

The sum of the weighted temperature values T1 to Tn is subsequently divided by the sum of the allocated weighting factors $t_{weighting}$, in other words the weighted time. The result is the weighted mean value (described in FIG. 2 as "T_Batt_weighted") of the battery in the prevailing time interval.

In step S3, the calculated prevailing weighted mean value is then compared with a predetermined desired temperature value that is not to be exceeded.

In step S4, the maximum permissible charging and discharging currents are then adjusted where necessary. If the calculated prevailing weighted mean value is less than or equal to the predetermined desired temperature value, the current thresholds are not adjusted in a temperature-dependent manner. If the prevailing weighted mean value is greater than the desired temperature value, the upper thresholds for the charging and discharging currents are corrected and decreased in such a manner that no further increase of the cell temperature takes place. The charging and discharging currents are not reduced to 0 in the present case. In order to achieve smoother transitions, a lower and an upper maximum desired temperature are defined, between which the reduction of the upper thresholds for the charging and discharging currents increase in a linear manner.

It has been mentioned above that the weighted temperature mean value is continuously formed as a moving mean value. After step S4, the closed loop control begins afresh. The new prevailing time interval now comprises the measuring points in time $t_i$, I=2 to n+1. The newly-measured measured temperature values of the individual cells $T_{cell}$ at the point in time $t_{n+1}$ replace the oldest measured temperature values of the individual cells $T_{cell}$ that are stored in the storage device. Starting from the prevailing point in time $t_{n+1}$, the respective n oldest measured temperature values $T_2$ to $T_{n+1}$ of the energy storage device are consequently used in turn in step S2 to form the mean value that is moving and consequently generally changing over time, whereby it is rendered possible to reliably and continuously determine the progression of the previous mean temperature in the energy storage device.

In accordance with the present embodiment variant, in addition to the temperature-dependent adjustment of the maximum permissible charging and/or discharging currents of the energy storage device, an adjustment is additionally performed on the basis of the previous loading of the energy storage device and/or on the basis of power required by the vehicle.

As is illustrated schematically in FIG. 2, the open loop control unit 2 is configured for this purpose so as to determine a previous loading of the battery on the basis of stored operating data that provide the charging and/or discharging currents of the energy storage device in a prevailing and/or preceding time interval (described in FIG. 2 as "I_Batt"). In other words, the open loop control unit 2 predicts in dependence upon the previous current loading of the battery the permissible upper thresholds for the charging and discharging current for newly beginning time intervals of predetermined length, described in FIG. 2 as "adjusted current thresholds per time interval". These upper thresholds provide the maximum permissible charging and discharging currents of the energy storage device in each case for the time intervals of, by way of example, 2, 10 and 30 seconds. These thresholds take into account by way of example the maximum current thresholds that are adjusted depending on the duration of the serviceable life of the cell and also the adherence to the upper voltage thresholds and lower voltage thresholds. These values take into account in this respect a previous loading by virtue of the fact that the current thresholds that are adjusted depending on the duration of the serviceable life of the cell also include the temporal length of a current loading that cannot be exceeded. For this purpose, the previous loading is determined by means of drawing off current or outputting current and the prevailing current threshold and future current threshold are accordingly decreased. If, by way of example, a higher charging current may be present for a total of 10 s and at the point in time of calculating the prevailing current threshold said higher charging current has already been applied over 5 s, the thresholds can be adjusted in so far as that this charging current is only still possible for a further 5 s. For current thresholds that are further in the future, these current thresholds are reduced in so far as that no current threshold in any time interval is exceeded or no current falls below the lower threshold while taking into account the previous loading. Likewise, the previous loading leads to changing internal resistances, which influences the current thresholds so as to maintain the voltage thresholds. A higher internal resistance by means of drawing off current on a longer term basis leads to a higher internal resistance in the discharging direction. This in turn leads to a lower current that can be drawn off without falling below the lower voltage threshold.

Following this initial temperature-dependent adjustment of the current thresholds, the temperature-dependent additional adjustment is performed on the basis of the weighted mean value of the battery temperature, as is described above. This is illustrated in FIG. 2 by the calculating step "thermal limitation". The thermal limitation as a result of the prevailing weighted mean value of the battery temperature consequently leads to corrected values for the current thresholds ("corrected adjusted current thresholds per time interval" in FIG. 2) in the case of the prevailing weighted mean value being greater than the desired temperature value. The corrected values then provide where necessary adjusted upper thresholds for the maximum permissible charging and discharging currents of the energy storage device in each case for the time intervals of for example 2, 10 and 30 seconds.

The values of the maximum permissible charging and/or discharging currents that are determined and where necessary adjusted by the open loop control unit 2 of the energy storage device in accordance with the aforementioned aspects are then continuously transmitted to the vehicle control unit that controls the drive train components of the motor vehicle, illustrated in FIG. 2 by "output". The vehicle control unit 1 is configured in accordance with the received values of the maximum charging and/or discharging currents so as to control an electrical machine as an actuator, the electrical machine being supplied with electrical energy by the energy storage device, said electrical machine being in particular the inverter of the motor vehicle.

Although the invention has been described with reference to specific exemplary embodiments, it is evident to a person skilled in the art that various changes can be performed and equivalents can be used as a substitute without departing from the scope of the invention. In addition, many modifications can be performed without departing from the associated scope. Consequently, the invention is not to be limited to the disclosed exemplary embodiments but rather is to include all the exemplary embodiments that fall within the scope of the attached patent claims. In particular, the invention also claims protection for the subject matter and the features of the dependent claims irrespective of the claims to which reference is made.

LIST OF REFERENCE NUMERALS

1 Vehicle control unit
2 Battery control unit
3 Storage device

The invention claimed is:

1. A method for limiting current in a temperature-dependent manner of an electrical energy storage device for storing electrical energy, by adjusting at least one of a maximum permissible charging current and a maximum permissible discharging current of the electrical energy storage device in dependence upon a temperature of the electrical energy storage device, wherein the adjusting comprises the following steps:
   determining multiple temperature values of the electrical energy storage device that follow one another chronologically during a prevailing time interval;
   determining a prevailing mean temperature value of the electrical energy storage device from the multiple temperature values of the electrical energy storage device determined during the prevailing time interval;
   comparing the determined prevailing mean temperature value with a predetermined desired temperature value; and
   limiting the at least one of the maximum permissible charging current and the maximum permissible discharging current of the electrical energy storage device if the determined prevailing mean temperature value is greater than the desired temperature value.

2. The method according to claim 1, wherein the prevailing mean temperature value of the electrical energy storage device is determined as a weighted mean value, wherein high temperatures of the electrical energy storage device are weighted more heavily than low temperatures of the electrical energy storage device.

3. The method according to claim 2, wherein the weighted mean value is determined by providing a lookup table allocating weighting factors for temperature values of the electrical energy storage device, determining corresponding weighting factors for the each of the multiple temperature values of the electrical energy storage device using the lookup table, and determining the weighted mean value by multiplying each of the multiple temperature values of the electrical energy storage device of the prevailing time interval by the corresponding weighting factor, subsequently determining a sum of the multiplied values, and dividing the resulting sum of the multiplied values by a sum of the corresponding weighting factors.

4. The method according to claim 1, wherein the prevailing mean temperature value of the electrical energy storage device is continuously determined and the at least one of the maximum permissible charging current and the maximum permissible discharging current of the electrical energy storage device is continuously adjusted, in that the temperature values of the electrical energy storage device that are used so as to form the prevailing mean temperature value are recorded in a storage device and a moving mean value is continuously formed from a specific number of the most recently stored temperature values of the electrical energy storage device, wherein in each case the oldest temperature value of the electrical energy storage device stored in the storage device is replaced by the newest temperature value of the electrical energy storage device.

5. The method according to claim 1, wherein the maximum permissible charging current is an upper threshold of the permissible current, with which the electrical energy storage device can be charged for a duration of a newly beginning time interval of a predetermined length, and the maximum permissible discharging current is an upper threshold of the current that can be drawn off for the duration of a newly beginning time interval of a predetermined length, wherein the adjusting the at least one of the maximum permissible charging current and the maximum permissible discharging current of the electrical energy storage device is performed by adjusting these upper thresholds.

6. The method according to claim 5, wherein each of the at least one of the maximum permissible charging current and the maximum permissible discharging current of the electrical energy storage device are set in relation to at least two time intervals of different lengths.

7. The method according to claim 1, further comprising the steps:
   determining a previous loading of the electrical energy storage device based on stored operating data that provide charging currents and discharging currents of the electrical energy storage device in one of the prevailing time interval and a previous time interval; and
   adjusting the at least one of the maximum permissible charging current and the maximum permissible discharging current of the electrical energy storage device in dependence upon the determined previous loading of the electrical energy storage device.

8. The method according to claim 7, wherein the at least one of the maximum permissible charging current and the maximum permissible discharging current of the electrical energy storage device is continuously adjusted in dependence upon the determined previous loading of the electrical energy storage device, wherein a first adjustment of the respective hitherto valid the at least one of the maximum permissible charging current and the maximum permissible discharging current of the electrical energy storage device is performed in dependence upon the determined previous loading of the electrical energy storage device and subsequently a second adjustment is performed in dependence upon the comparison of the determined prevailing mean temperature values of the electrical energy storage device with the predetermined desired temperature value.

9. The method according to claim 1, further comprising continuously transmitting, by an open loop control device of the electrical energy storage device, adjusted values of the at least one of the maximum permissible charging current and the maximum permissible discharging current of the electrical energy storage device to a vehicle control unit to control the drive train components of the motor vehicle, wherein the vehicle control unit is configured to control an electrical machine that is supplied with electrical energy by the electrical energy storage device in accordance with the received values of the at least one of the maximum permissible charging current and the maximum permissible discharging current of the electrical energy storage device.

10. A device for limiting the current in a temperature-dependent manner of an electrical energy storage device for electrical energy, said device being configured to implement the method according to claim 1.

11. A vehicle having a device as claimed in claim 10.

12. The vehicle of claim 11, wherein the vehicle is a commercial vehicle.

13. The method according to claim 6, wherein a length of a first time interval is in the single digit second range and a length of a second time interval is in the double digit second range.

14. The method according to claim 1, further comprising the steps of:
- receiving, by a vehicle control unit, the maximum permissible discharging current and the maximum permissible charging current from an open loop control device of the electrical energy storage device;
- controlling, by a vehicle control unit, an electrical machine that is supplied with electrical energy by the electrical energy storage device, by controlling an actual discharge current and an actual charge current from or to the electrical energy storage device, wherein the vehicle control unit prevents the actual discharge current from exceeding the maximum permissible discharge current and prevents the actual charge current from exceeding the maximum permissible charge current.

15. The method according to claim 14, wherein the prevailing mean temperature value of the electrical energy storage device is continuously determined and the at least one of the maximum permissible charging current and the maximum permissible discharging current of the electrical energy storage device is continuously adjusted.

\* \* \* \* \*